United States Patent [19]

Kinghorn et al.

[11] Patent Number: 4,570,154

[45] Date of Patent: Feb. 11, 1986

[54] DATA ENTRY KEYBOARD APPARATUS

[75] Inventors: John R. Kinghorn, Sutton; Raymond J. Fisher; Terence A. Douglas, both of Banstead, all of England

[73] Assignee: U.S. Philips Corporation, New York, N.Y.

[21] Appl. No.: 491,514

[22] Filed: May 4, 1983

[30] Foreign Application Priority Data

May 7, 1982 [GB] United Kingdom ............ 8213221

[51] Int. Cl.⁴ ............................................. G06F 3/02
[52] U.S. Cl. ........................... 340/365 S; 340/365 R; 179/18 GF
[58] Field of Search ............ 340/365 R, 365 S, 365 E; 178/17 C; 179/18 GF, 18 J, 90 K

[56] References Cited

U.S. PATENT DOCUMENTS

| | | | |
|---|---|---|---|
| 3,949,365 | 4/1976 | Kashio | 340/365 S |
| 3,950,743 | 4/1976 | Hatano | 340/365 S |
| 4,064,399 | 12/1977 | Muranaka | 340/365 R |
| 4,138,917 | 2/1979 | Sakashita | 340/365 S |
| 4,288,786 | 9/1981 | Ledniczki | 340/365 C |
| 4,326,194 | 4/1982 | Pepe | 340/365 S |
| 4,335,374 | 6/1982 | Nyuji | 340/365 S |
| 4,408,184 | 10/1983 | Ishii | 340/365 S |

Primary Examiner—Marshall M. Curtis
Assistant Examiner—Michael F. Heim
Attorney, Agent, or Firm—Robert T. Mayer; Steven R. Biren

[57] ABSTRACT

A data entry keyboard apparatus comprises a key-switch array (900) and associated electronic logic circuits (941). The key switches (901) of the array are so interconnected with each other and with connection terminals (902) to (905) of the logic circuits (941) that any one of these connection terminals can be interconnected with any other one by the actuation of an appropriate key-switch. The logic circuits (941) have a first set of coincidence gates (912) one for each key-switch (901). One input of each of these gates is connected to receive a particular one of a plurality of pulse signals of different phases produced by a pulse sequencer (906). A second input of each of these gates is connected to receive the same pulse signal via the key-switch array when the appertaining key-switch (901) is actuated. The coincidence or detection at an AND-gate of the same pulse signal at both inputs produces an output signal signifying actuation of the appertaining key-switch. The apparatus has n/2×(n−1) key switches (901) in the array, where n is the number of connection terminals. Two additional key switch sets (916 to 919) and (920 to 923) are provided in the array (900) without increasing the number of connection terminals by utilizing existing ground and clock pulse terminals to enter inputs to respective further coincidence gate sets (924 and 927) which pertain to the two additional key switch sets, respectively. Respective groups of latches (913, 914; 925,926; and 928,929), feed the gate output signals to an encoder (915) via a priority detector (936 to 939).

9 Claims, 8 Drawing Figures

DATA ENTRY KEYBOARD APPARATUS

BACKGROUND OF THE INVENTION

This invention relates to data entry keyboard apparatus of a type comprising an array of key switches and associated electronic logic circuits for detecting the actuation of a key switch and providing an output signal condition corresponding to an actuated key switch, in which the logic circuits have a plurality of connection leads for their interconnection with the key-switch array and include pulse sequencing means for producing in a recurrent cycle a plurality of pulse signals of different phases which are applied to successive ones of said connection leads to produce periodic active signal levels thereon, and the key switches of the array are so interconnected with each other and with said connection leads that any one of these leads can be interconnected with any other one by the actuation of an appropriate key switch, the output signal condition being determined by the active signal level of a particular pulse signal which is fed from one connection to another via an actuated key switch.

Data entry keyboard apparatus of the above type, examples of which are described in United Kingdom Patent Specification Nos. 1,415,469; 1,478,633; and 1,569,604, has use in, for example, electronic apparatus such as electronic desk and pocket calculators, and remote control modules for television receivers.

In a data entry keyboard apparatus of known type as set forth above, $n/2 \times (n-1)$ key switches can be contained in the key-switch array, where n is the number of connection leads. Thus, for example, the total number of key switches which the array can contain when the logic circuits have six ($n=6$) connection leads is fifteen. In order to increase the number of key switches which the array can contain, it has hitherto been necessary to increase the number of connections that the logic circuits have for their interconnection with the array, and the increase in the number of key switches for each additional connection is very advantageous compared with conventional matrix arrays. However, this requirement of additional connections exacerbates the well-known problem that exists in the design of integrated circuits of using as few external connections as possible for interconnection between the internal circuitry of the integrated circuit and external circuitry. The fewer the number of external connections that are required, the more cost effective an integrated circuit package becomes, possibly even where additional circuitry is included in the integrated circuit in order to save an external connection.

SUMMARY OF THE INVENTION

The present invention provides a mitigating solution to this well-known problem when the logic circuits of data entry keyboard apparatus of known type as set forth above are implemented as integrated circuits.

According to the invention, a data entry keyboard apparatus of the type set forth above is characterized in that the key-switch array includes a set of additional key switches which afford selective interconnection between a common connection and a respective one of said connection leads, and in that means are present for supplying to said common connection an active signal condition which produces on any one of said connection leads, when the relevant additional key switch is actuated, an active signal level for determining an output signal condition corresponding to the actuated additional key switch.

In a first embodiment of data entry key board apparatus according to the invention, said common connection is a supply rail to which the common connection is connected, said pulse sequencing means produces an additional pulse signal in said recurrent cycle, and said logic circuits include priority detector means for permitting an output signal condition occurring during the period of the additional pulse signal to be selected in preference to another output signal condition which is determined by actuation of one of the existing key switches and which occurs during the period of another pulse signal in the same pulse cycle. The period of the additional pulse signal is thus allotted to detecting the actuation of any of the additional key switches.

In a second embodiment of data entry keyboard apparatus according to the invention, said common connection is a clock pulse connection, said means is a clock pulse generator which is included in said logic circuits for producing on said clock pulse connection clock pulses such that for successive cycles of said pulse signals the clock pulse connection is alternately at a quiescent signal condition and at said active signal condition, and said logic circuits include priority detector means for permitting an output signal condition which is determined by actuation of one of said additional key switches when the clock pulse connection is at the active signal condition to be selected in preference to another output signal condition which is determined by actuation of one of the existing key switches.

These first and second embodiments can be provided separately or in combination, to add n or 2n additional key switches, as the case may be, to a key-switch array which is interconnected with n connection leads. When these embodiments are provided in combination, the priority detector means in the logic circuits can be further arranged to permit the output signal condition produced by actuation of one of the additional keys for the second embodiment to be selected in preference to an output signal condition produced by actuation of one of the additional keys for the first embodiment.

Since the first embodiment uses a supply rail to provide the active signal level from the key-switch array into the logic circuits for n additional key switches, no additional connection leads are required on the logic circuits specifically for these n additional key switches. Also, since the second embodiment uses a clock pulse connection to provide the active signal level from the key-switch array into the logic circuits for another n additional key switches, no additional connection leads may be required on the logic circuits specifically for these other n additional key switches, if an existing clock pulse connection which is already present for some other purpose can be utilized.

Particular embodiments of the invention which are considered hereinafter by way of example are implemented using logic circuits which are formed by discrete logic elements. In this respect, these embodiments conform to the manner in which the prior art structures have been described in their respective specifications, and it has been found to be expedient in the interests of clarity and simplicity to describe different features of the present invention in this manner also. However, it is expected that, in practice, in carrying the present invention into effect, preference may be given to the use of microprocessors or microcomputers to implement the logic circuits in line with current trends.

Therefore, in data entry keyboard apparatus according to the present invention, the logic circuits can be implemented as a microprocessor or microcomputer comprising a plurality of connection terminals for interconnection with the key-switch array; pulse sequencing means for producing a plurality of pulse signals of different phases; and means for performing recurrently a plurality of comparison functions which pertain respectively to the key switches provided in the key-switch array, these comparison functions involving the comparison of signals applied indirectly to said means via the key-switch array with pulse signals applied directly to said means, and each comparison function providing an output signal condition on comparing the pulse signals of the same active level applied to it both indirectly and directly, said output signal condition signifying detection of the actuation of the appertaining key switch.

A microprocessor or microcomputer which is suitable for the purposes of the invention can be any one of the types which are currently available commercially. For instance, the type 8048 (Intel) would be suitable. The comprehensive user manual which is issued for such apparatus by the manufacturers would readily enable a person skilled in the art to take various features of the invention as described herein using discrete logic elements and perform them using a commercially-available microprocessor or microcomputer. Therefore, it is not necessary to consider such an implementation of the logic circuits in any further detail here for an understanding of the present invention.

In data entry keyboard apparatus according to the invention, the various signals pass along the connection leads between the key-switch array and connection terminals for the logic circuits in both directions. As will be seen later when specific embodiments of the apparatus are being described, this two-way passage of the pulse signals requires that at least some of the connection terminals are provided with both input port means and output port means. Conveniently, a quasi-bidirectional input/output port circuit is provided for this function.

A suitable form of such an input/output port circuit for a connection terminal comprises biasing means connected to the connection terminal and serving to bias the terminal at a quiescent signal level, this bias being overcome when the connection terminal receives an active signal level applied to the connection terminal in the input direction, the circuit further comprising a latch connected to receive a pulse signal to be applied to the connection terminal in the output direction and latched by a write pulse during the period of the pulse signal to drive an output device which holds the connection terminal at the active signal level, the latch being unlatched by a write pulse occurring during the period of the next pulse in the recurrent cycle of pulse signals to drive a resetting device which restores the connection terminal to the quiescent signal level at which it is then held again by the biasing means.

The latch can be a D-type flip-flop which has the pulse signal, to be applied to the connection terminal in the output direction, applied to its D-input and the write pulses applied to its clock input, the inverting output of the flip-flop being connected to drive the output device, and the non-inverting output being connected to one input of a coincidence gate, the other input of which is connected to receive the write pulses and the output of which is connected to drive the resetting device.

BRIEF DESCRIPTION OF THE DRAWING

In further considering the nature of the invention, reference will now be made by way of example to the accompanying drawing, in which.

DESCRIPTION OF THE PREFERRED EMBODIMENTS

Figures 1, 2:
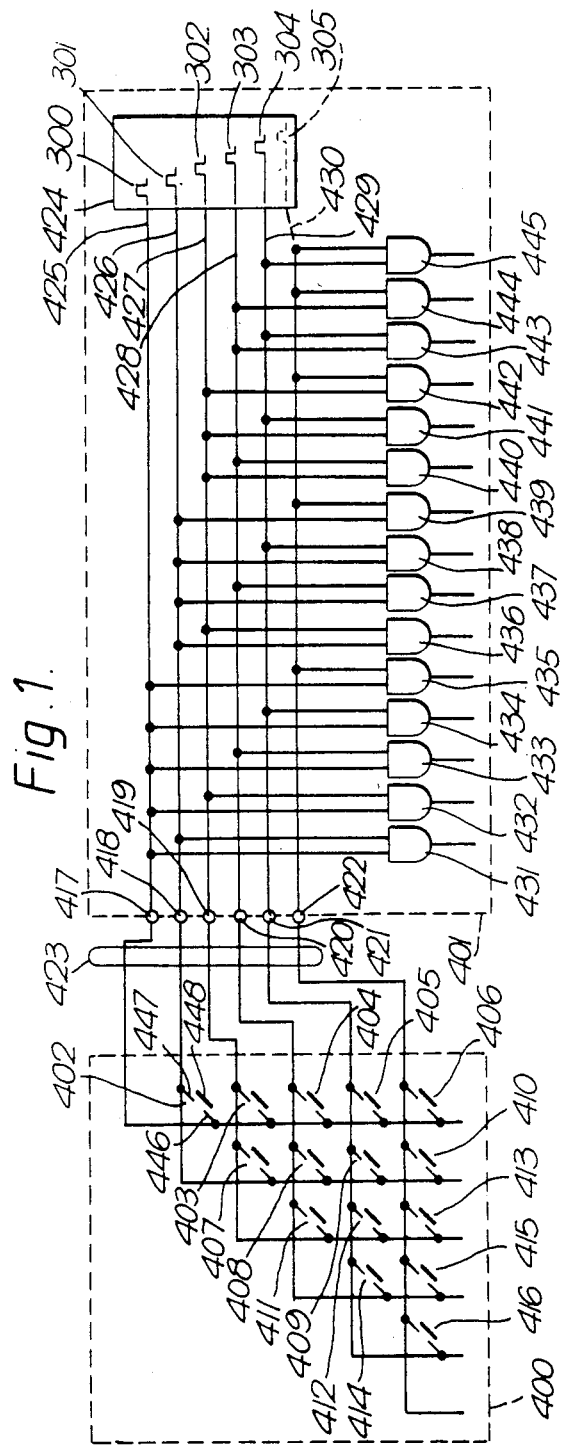
FIG. 1 shows an arrangement for the interconnection between an array of key switches and associated logic circuits of data entry keyboard apparatus of the type in which the present invention is embodied.
FIG. 2 shows idealized pulse signals which are used in the arrangement of FIG. 1.

Referring to the drawings, FIG. 1 shows a key switch array 400 and a portion of associated logic circuits 401 of data entry keyboard apparatus, which portion serves only to illustrate the interconnection between the array 400 and the logic circuits 401. The key switch array 400 comprises fifteen key switches 402 to 416, and the logic circuits 401 have six connection terminals 417 to 422 for the interconnection with the key switches of the array 400. Within the key switch array 400, the individual key switches 402 to 416 are so connected between pairs of lines of a group of six lines 423 which are connected respectively to the connection terminals 417 to 422 that any one of these connection terminals can be interconnected with any one of the other of these terminals by actuation of the appropriate key switch. For instance, when the key switch 402 is actuated, the connection terminals 417 and 418 are interconnected. More specifically, each of the key switches 402 to 416 comprises, as shown for key switch 402, a first contact 446 and a second contact 447 which are electrically interconnected by a bridge member 448 on actuation of the key switch to interconnect two connection terminals (417 and 418). Consideration of the key switch array 400 will show that connection terminal 417 has the first contacts of five key switches connected to it, connection terminal 418 has the first contacts of four key switches and the second contact of one key switch connected to it, connection terminal 419 has the first contacts of three key switches connected to it, and so on, with the last connection terminal 422 having the second contacts of five key switches connected to it.

The logic circuits 401 include a pulse sequencer 424 which produces a sequence of five pulse signals 300 to 304 of different phases on respective output leads 425 to 429 in a recurrent cycle. These pulse signals 300 to 304 are shown in FIG. 2. The output leads 425 to 429 are connected respectively to the first five connection terminals 417 to 421. A further lead 430 may be connected to the sixth connection terminal 422. The logic circuits 401 also include fifteen two-input AND-gates 431 to 445, and each possible combination of any two of the six leads 425 to 430 is connected to the two inputs of a respective one of these AND-gates. The fifteen key switches 402 to 416 pertain respectively to the fifteen AND-gates 431 to 445, and when a particular key switch is actuated the appertaining AND-gate will have one of the pulse signals 300 to 304 in the pulse signal sequence applied to both inputs, that is, to one input directly and to the other input indirectly via the actuated key switch, and will thereby produce an output signal which signifies the actuation of that key switch. Each of the other AND-gates will receive this pulse signal at one input only, or at neither input. The following TABLE I gives the circuit conditions for each key switch.

TABLE I

| Key Switch | Terminals Interconnected | Lead Combinations Affected | Pulse Signal Used | AND-Gate Opened |
|---|---|---|---|---|
| 402 | 417,418 | 425,426 | 300 or 301 | 431 |
| 403 | 417,419 | 425,427 | 300 or 302 | 432 |
| 404 | 417,420 | 425,428 | 300 or 303 | 433 |
| 405 | 417,421 | 425,429 | 300 or 304 | 434 |
| 406 | 417,422 | 425,430 | 300 | 435 |
| 407 | 418,419 | 426,427 | 301 or 302 | 436 |
| 408 | 418,420 | 426,428 | 301 or 303 | 437 |
| 409 | 418,421 | 426,429 | 301, 304 | 438 |
| 410 | 418,422 | 426,430 | 301 | 439 |
| 411 | 419,420 | 427,428 | 302 or 303 | 440 |
| 412 | 419,421 | 427,429 | 302 or 304 | 441 |
| 413 | 419,422 | 427,430 | 302 | 442 |
| 414 | 420,421 | 428,429 | 303 or 304 | 443 |
| 415 | 420,422 | 428,430 | 303 | 444 |
| 416 | 421,422 | 429,430 | 304 | 445 |

From this TABLE I it can be seen that when key switch 402, for example, is actuated, the two connection terminals 417 and 418 are interconnected. With this condition, the occurrence of the pulse signal 300 on the lead 425 will result in this pulse signal being applied directly to one input of the AND-gate 431 over the lead 425, and this pulse signal also being applied indirectly to the other input of the AND-gate 431 via the actuated key switch 402 and over the lead 426. The AND-gate 431 will therefore produce an output signal to signify the actuation of the key switch 402. The pulse signal 300 is also applied to one input of each of the AND-gates 432 to 435, but none of these four gates is opened because no pulse signal is applied to its other input. The remaining AND-gates 436 to 445 do not receive the pulse signal 300 at either input, so they also all remain closed. During the presence of the pulse signal 300, actuation of any of the key switches 403 to 406 will also produce an output signal from the appropriate one of the gates 432 to 435. If the key switch 402 is actuated when the pulse signal 301 occurs, the AND-gate 431 is again opened to produce its output signal. In this instance, the pulse signal 301 is applied directly to one input of this AND-gate and indirectly via the actuated key switch 402 to the other input. During the presence of the pulse signal 301, actuation of any of the key switches 407 to 410 will also produce an output signal from the appropriate one of the gates 436 to 439. It can be seen from the TABLE I that most of the key switches can produce an output signal from the appropriate AND-gate, when actuated, during the occurrence of either of two of the pulse signals of different phases. As shown in dotted lines in FIG. 1, a sixth pulse signal 305 may be applied to the lead 430 which then becomes another output lead from the pulse sequencer 424. With this sixth pulse signal present, two pulse signals, instead of only one, are now involved when any one of the gates 406, 410, 413, 415 and 416 is actuated in the same way that two pulse signals are involved for the other gates.

Figure 3:
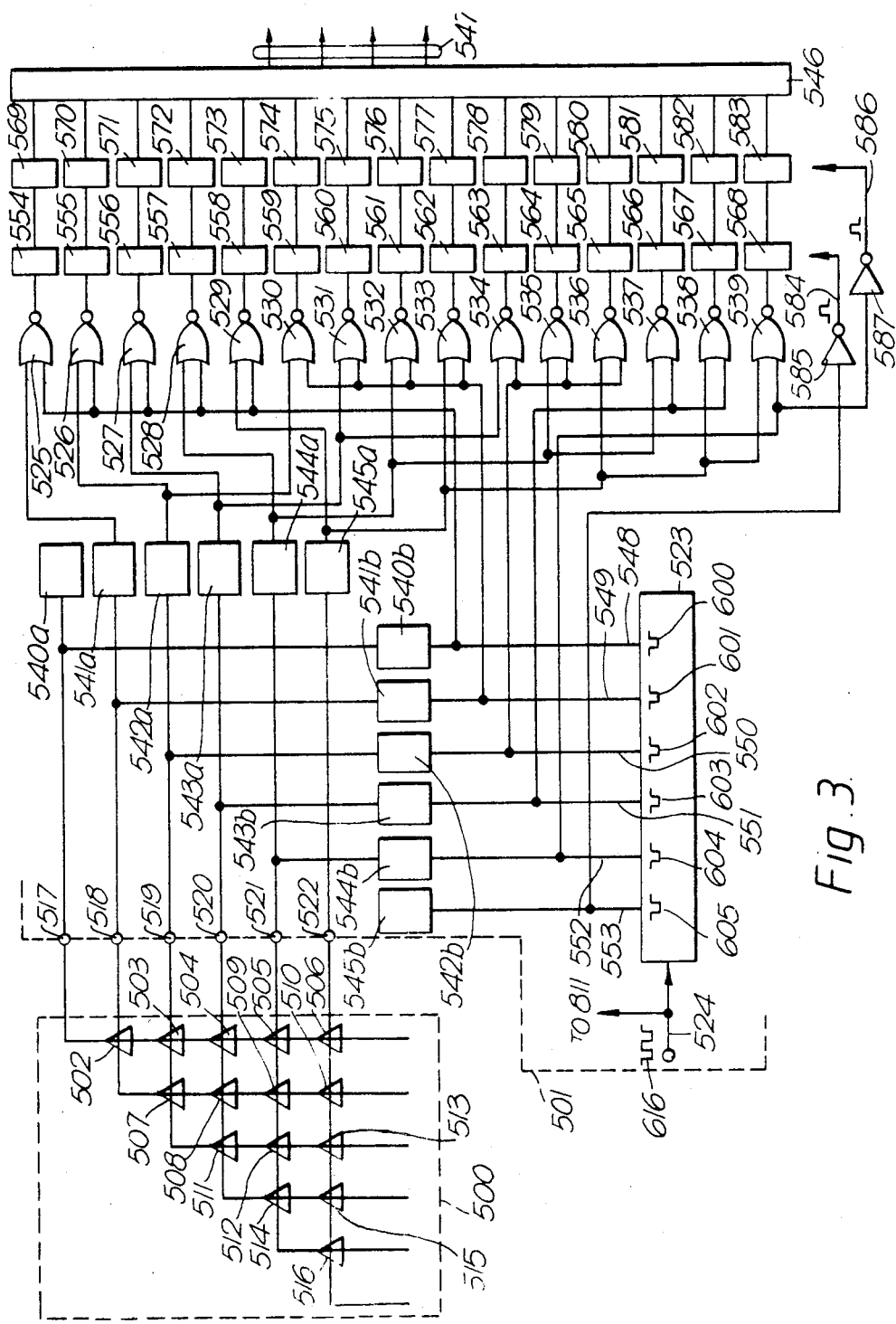
FIG. 3 is a circuit diagram of a data entry keyboard apparatus of the type in which the present invention is embodied.
Figure 5:
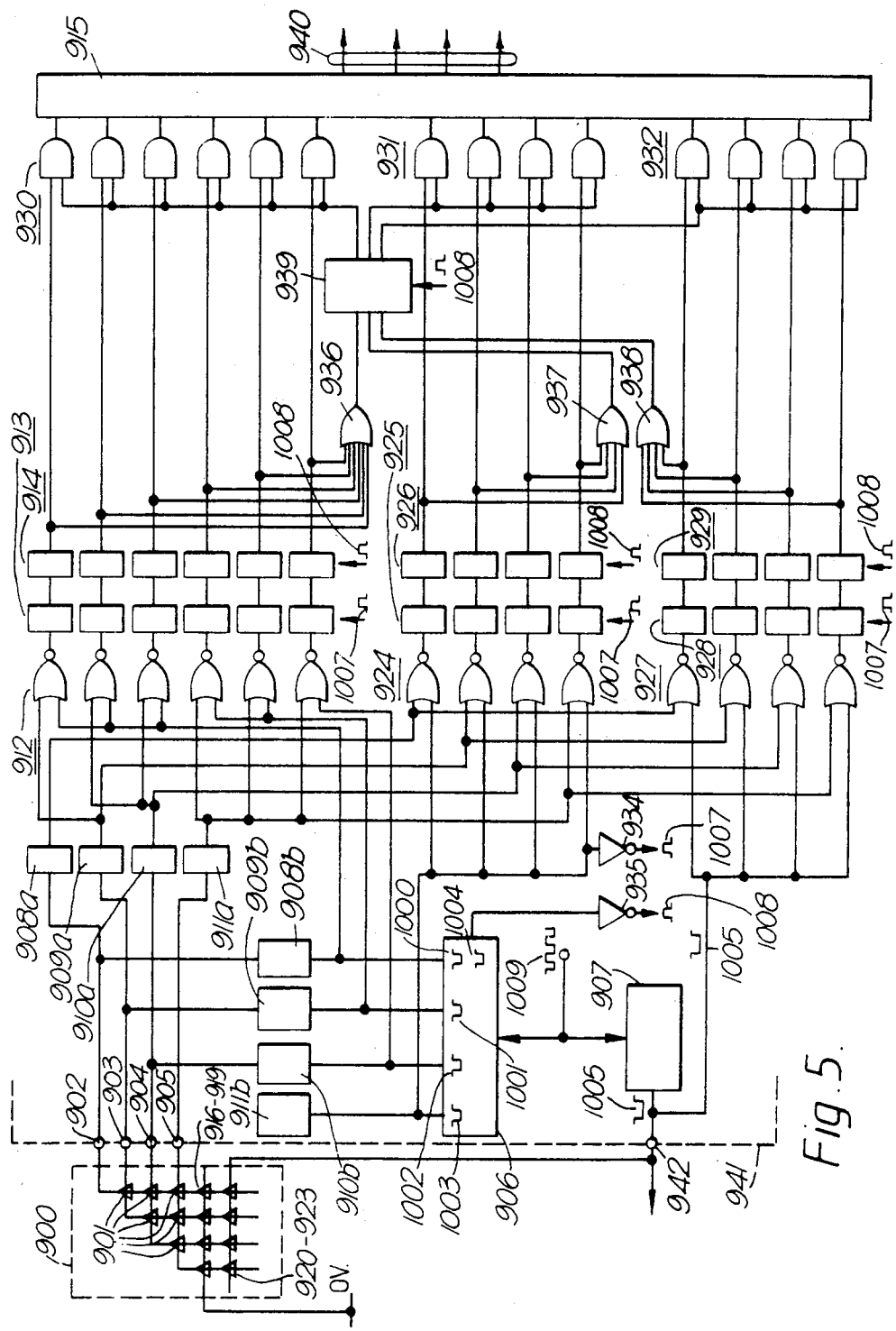
FIG. 5 is a circuit diagram of data entry keyboard apparatus embodying the present invention.
Figure 7:
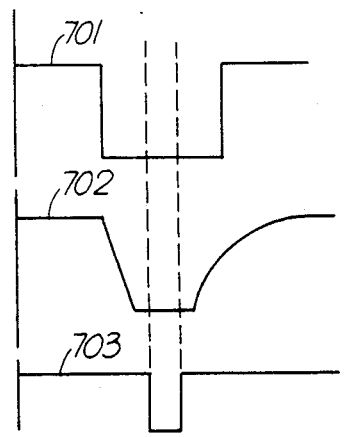
FIG. 7 shows idealized waveform diagrams illustrating the coincidence gating used in the apparatus of FIG. 3.

It will be appreciated from the foregoing description of FIG. 1, that depending on which pulse signal is present and which key switch is actuated, signals in effect can pass in either direction through the connection terminals between the key-switch array and the logic circuits. In order to provide for such signal passage in either direction, a input/output port circuit can be provided in the logic circuits with respect to each connection terminal. The two apparatuses next to be described with reference to FIGS. 3 and 5 are provided with such input/output port circuits. For the sake of convenience in the layout of the logic circuits in each of these apparatuses, separate input and output port circuits are shown. However, it is envisaged that in practice single input/output port circuits would be used. FIG. 7 shows a specific form of single input/output port circuit which is suitable for this application.

Referring now to FIG. 3, the apparatus there shown comprises a key-switch array 500 and logic circuits 501. The key-switch array 500 comprises fifteen key switches 502 to 516 which are interconnected with six connection terminals 517 to 522 in the same manner that the key-switches 402 to 416 and the connection terminals 417 to 422 are interconnected in FIG. 1. The logic circuits 501 include fifteen two-input NOR-gates 525 to 539 which pertain respectively to the fifteen key switches 502 to 516. The use of NOR-gates as the coincidence gates in this apparatus, rather than AND-gates as used in FIG. 1, is merely for expediency in that the input signal levels required for these NOR-gates are compatible with signal levels obtained from a particular form of single input/output port circuit shown in FIG. 8. Six such single input/out port circuits, one for each of the six connection terminals 517 to 522, are provided in the logic circuit 501. These single input/output port circuits are shown as separate input and output portions, the input portions being portions 540a to 545a and the corresponding output portions being portions 540b to 545b.

The logic circuits 501 further include a pulse sequencer 523 which is responsive to clock pulses 616 on a lead 524 from a suitable clock pulse source (not shown) to produce pulse signals of different phases on output leads 548 to 553, respectively. These are the pulse signals 600 to 605 shown in FIG. 4, together with the clock pulses 616. The pulse signals 600 to 604 are applied via the port circuit output portions 540b to 544b, respectively, to the connection terminals 517 to 521, respectively. These pulse signals 600 to 604 are also applied for one input of one or more of the gates 525 to 539 to serve as what may be considered as priming signals for these gates. The port circuit input portions 541a to 545a are connected to the second input of one or more of the gates 525 to 539. In general, in the operation of this apparatus shown in FIG. 3, the occurrence of a pulse signal primes one or more of the gates at one input, and a primed gate is opened to produce an output signal when the same pulse signal is applied to the other input of the gate via an actuated key switch. Although more than one gate may be primed, depending on the pulse signal, and although a pulse signal may also be applied directly to said other input of one or more of the gates, as well as indirectly via an actuated key switch, the circuit connections are such that for each key switch, only one gate is opened uniquely when that key switch is actuated. For this embodiment of data entry keyboard apparatus, the circuit conditions that occur for each key switch actuation are given in the following TABLE II.

TABLE II

| Key Switch Actuated | Terminals Interconnected | Pulse Signals Passed | NOR-gates 1st input Primed | NOR-gates 2nd input Enabled | NOR-gate Opened |
|---|---|---|---|---|---|
| 502 | 517/518 | 600 | 525,526,527 528,529 | 525 | 525 |
|  |  | 601 | 530,531 532,533 | 525 | — |
| 503 | 517/519 | 600 | 525,526,527 528,529 | 526,530 | 526 |
|  |  | 602 | 534,535,536 | 526,530 | — |
| 504 | 517/520 | 600 | 525,526,527 528,529 | 527,531,534 | 527 |
|  |  | 603 | 537,538 | 527,531,534 | — |
| 505 | 517/521 | 600 | 525,526,527 528,529 | 528,532,535 537 | 528 |
|  |  | 604 | 539, | 528,532,535 537 | — |
| 506 | 517/522 | 600 | 525,526,527 528,529 | 529,533,536 538,539 | 529 |
| 507 | 518/519 | 601 | 530,531 532,533 | 525,526,530 | 530 |
|  |  | 602 | 534,535,536 | 525,526,530 | — |
| 508 | 518/520 | 601 | 530,531 532,533 | 525,527,531 534 | 531 |
|  |  | 603 | 537,533 | 525,527,531 534 | — |
| 509 | 518/521 | 601 | 530,531 532,533 | 525,528,532 535,537 | 532 |
|  |  | 604 | 539 | 525,528,532 538,539 | — |
| 510 | 518/522 | 601 | 530,531 532,533 | 525,533,536 538,539 | 533 |
| 511 | 519/520 | 602 | 534,535,536 | 526,530 527,531,534 | 534 |
|  |  | 603 | 537,538 | 526,530 527,531,534 | — |
| 512 | 519/521 | 602 | 534,535,536 | 526,530,535 528,532,537 | 535 |
|  |  | 604 | 539 | 526,530,535 528,532,537 | — |
| 513 | 519/522 | 602 | 534,535,536 | 526,530,529 533,536,538 539 | 536 |
| 514 | 520/521 | 603 | 537,538 | 527,531,534 528,532,535 537 | 537 |
|  |  | 604 | 539 | 527,531,534 528,532,535 537 | — |
| 515 | 520/522 | 603 | 537,538 | 527,531,534 529,533,536 538,539 | 538 |
| 516 | 521/522 | 604 | 539 | 528,532,535 537,529,533 536,538,539 | 539 |

From the above TABLE II it can be seen that when, for example, the key switch 509 is actuated, the terminals 518 and 521 are interconnected. When the pulse signal 601 occurs it primes the NOR-gates 530, 531, 533 directly at a first input. This pulse signal 601 is also applied via the interconnected terminals 518 and 521 to the second input of NOR-gates 525, 528, 532, 535 and 537. Of these latter gates only the gate 532 is also receiving the pulse signal 601 at the first input, so that this gate alone is opened to produce an output signal which signifies the actuation of the key switch 509. When the pulse signal 604 occurs with the key switch 509 actuated, the aforesaid latter gates receive this pulse signal 604 at their second inputs also. However, this pulse signal 604 only primes a first input of only the NOR-gate 539, so that with key switch 509 actuated, the occurrence of the pulse signal 604 does not cause any of the NOR-gates to open.

The data entry keyboard apparatus of FIG. 3 further includes a first group of latches 554 to 568. Suitably, each of these latches is comprised by a bistable circuit which is set by a high level signal applied to a setting input to produce at an output a higher level output signal which persists until a high level signal is applied to a re-setting input, when the output assumes a low level. A second group of latches 569 to 583 is also included in the apparatus. Suitably, each of these latter latches is comprised by a D-type flip-flop having a data input, a clock input and a data output, and being operable such that a signal level (high or low) at its data input is transferred to the data output when a clock signal is applied to the clock input and this signal level remains at the data output until the occurrence of the next clock signal, when the subsisting signal level at the data input is transferred to the data output.

The latches 554 to 568 have their setting inputs connected respectively to the outputs of the NOR-gates 525 to 539, and the latches 569 to 583 have their data inputs connected respectively to the signal outputs of the latches 554 to 568. The latches 554 to 568 all have their re-setting inputs connected to a lead 584 to receive a re-setting signal 607 (FIG. 4) which is derived from the pulse signal 605 by an inverter 585. The latches 569 to 583 all have their clock inputs connected to a lead 586 to receive a clock signal 606 which is derived from the pulse signal 604 by an inverter 587. (For the sake of clarity in the drawing, the actual connections of these re-setting and clock inputs to the relevant leads are not shown). The data outputs of the latches 569 to 583 are connected to an encoder 546 which has a group of output leads 547 on which it produces 4-bit binary signal codes corresponding to actuated key switches.

The two latches is cascade with respect to each NOR-gate, and thus with respect to each key-switch, form so-called "first press logic" which ensures that when a key-switch is actuated the corresponding 4-bit binary signal code is produced by the encoder 588 only once with respect to the actuation. More specifically, if for instance the key switch 508 is actuated for a period of time represented by the waveform 608 in FIG. 4, then the NOR-gate 531 will receive the (low level) pulse signal 601 coincidentally at both inputs twice during this period. The waveform 609 shows the resulting two (high level) output signals 610 and 611 produced by the NOR-gates 531. The first output signal 610 sets the latch 560 which thereby applies a high level output signal to the data input of the latch 575. This output signal, which is the signal 612 shown in waveform 613, is terminated when the latch 560 is reset by the re-setting signal 607. While the output signal 612 is present at the data input, the clock signal 606 occurs, so that the data output of the latch 575 assumes a high signal level. The second output signal 611 sets the latch 560 again, so that a second high level output signal 614 is applied to the data input of the latch 575, this second signal 614 being terminated like the first on the next occurrence of the re-setting signal 607. However, before this re-setting signal 607 recurs, the clock signal 606 occurs again, with the result that the data output of the latch 575 remains at the high signal level. At the third occurrence of the clock signal 606, which is outside the period 608 that the key-switch 508 was actuated, the latch 560 is in the reset condition so that a low output signal level is present at the data input of the latch 575. As a consequence, the data output of the latch 575 reverts to a low signal level. The waveform 615 shows the signal levels at the data output of the latch 575.

It will be appreciated that depending on which key switch is actuated, the length of the first latch output signals such as signals 612 and 614 will vary between a maximum duration and a minimum duration depending on which pulse signal is gated by the relevant NOR-gate. Thus the gating of pulse signal 600 will result in such signals of maximum duration while the gating of pulse signal 604 will result in such signals of minimum duration. In all cases, since the clock signal 606 occurs before such signals are terminated, the data input of the second latch remains at a high signal level.

Because the clock signal 606 is derived by inversion from the pulse signal 604, it may be necessary to introduce into the logic a short delay for the clock 606 to ensure that the minimum duration signals (corresponding to signals 612 and 614) which will be produced when the pulse signal 604 is involved, will have put the data input of a second latch at a high signal level by the time the clock signal 606 is applied to the clock input of that latch.

Also, because the logic involves the coincident gating of the same pulse signal applied over different paths to two inputs of the NOR-gates, such gating can include the well established technique of strobe pulsing. For instance, with reference to FIG. 7, if the pulse signal 701 represents a pulse signal applied directly to the first (priming) input of a NOR-gate, and the pulse signal 702 represents the same pulse signal applied to the second (enabling) input of the same NOR-gate via an actuated key switch, then strobe pulsing of the NOR-gate by a relatively short duration strobe pulse 703 will cause coincident signal levels to be looked for over a short period when both signals have optimum signal levels. Such strobe pulsing will tend to ensure correct coincidence gating notwithstanding the different transmission delays in the two separate paths taken by the same pulse signal.

Figure 8:
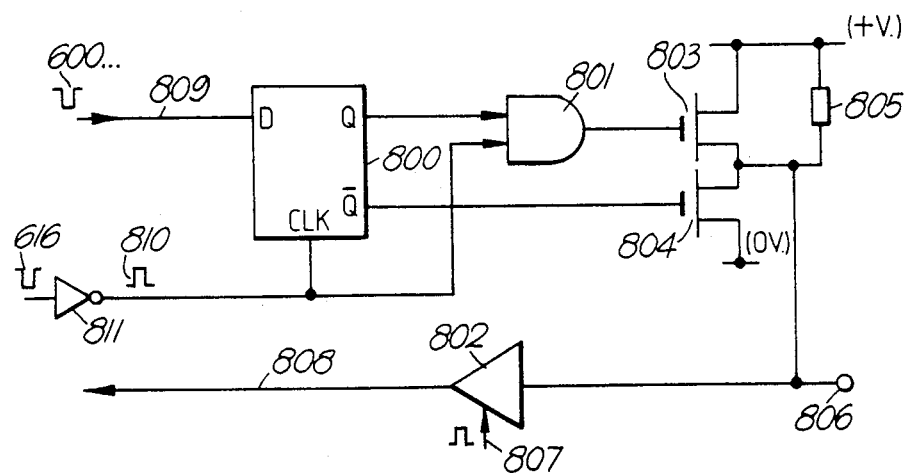
FIG. 8 is a circuit diagram of an input/output port circuit used in the apparatus of FIG. 3.

In the apparatus of FIG. 3, only the input portion 545a of the single input/output port circuit 545a/545b and the output portion 540b of the single input/output port circuit 540a/540b are used. FIG. 8 shows a suitable circuit for each of the single input/output port circuits used in the apparatus of FIG. 5. This circuit comprises a D-type flip-flop 800, an AND-gate 801, an input buffer amplifier 802, and an output stage comprising two field-effect transistors 803 and 804 and a high value resistor 805. An external connection terminal 806 is served by this circuit, the terminal 806 corresponding to any one of the external connection terminals in the apparatus of FIG. 3. In the quiescent condition of the circuit, neither of the transistors 803 and 804 is conductive and the terminal 806 has a high (1) signal level due to the connection of the resistor 805 between the terminal 806 and a supply rail (+V). As embodied in the apparatus of FIG. 3, a small amount of sustaining current would flow in resistor 805. When the circuit serves as an input port, the level at the terminal 806 changes from its high (1) signal level when a low level pulse signal is applied to it. Such a low level pulse signal will be one of the pulse signals 600 to 604 as applied to the terminal 606 via an actuated key switch. The low level pulse signal is passed via the input buffer amplifier 802 (which is assumed to be strobed from a strobe pulse lead 807) to a line 808 which is connected to an enabling input of one or more of the NOR-gates 525–539 in the apparatus of FIG. 3. This low (0) signal level presented by the circuit in its operation as an input port is non-latched and will therefore persist only as long as the low level pulse signal is applied to the terminal 806. Thus, when this pulse signal is terminated, the terminal 806, and therefore the line 808, will revert to the high (1) signal level.

Figure 4:
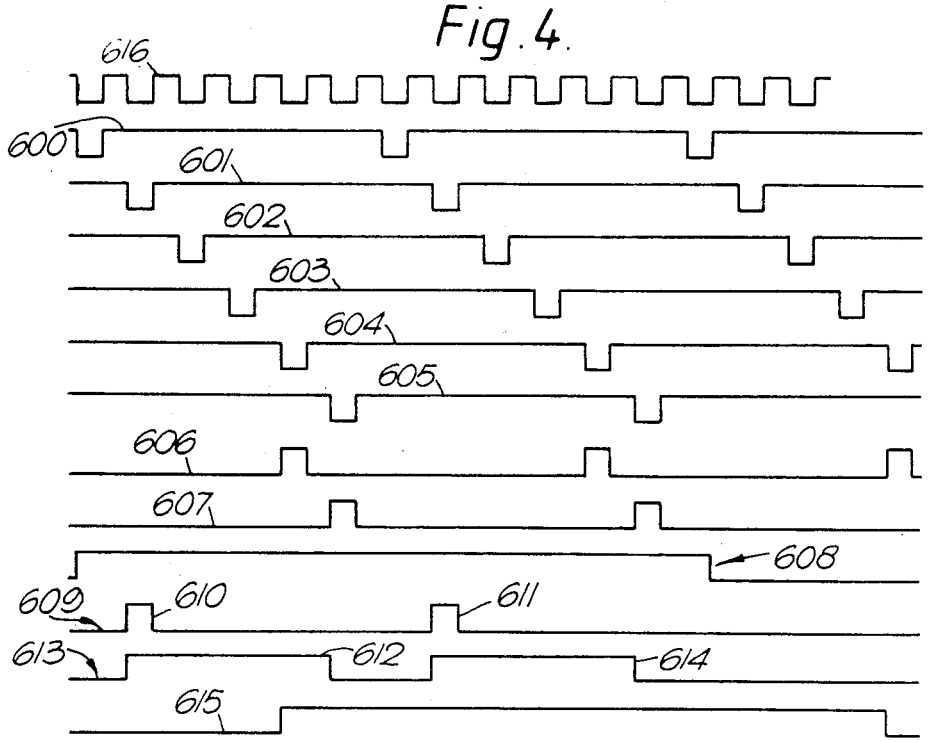
FIG. 4 shows idealized waveform diagrams of various pulse signals which occur in the operation of the apparatus of FIG. 3.

When the circuit serves as an output port, the signal level (0) or (1) present on a line 809 connected to the D-input of the flip-flop 800 appears at the Q-output (and its inverse appears at the $\overline{Q}$-output) in response to a write pulse 810 applied to the CLK-input of the flip-flop 800. This write pulse 810 is derived by an inverter 811 from the clock pulses 616 (FIG. 4). The line 809 is connected to a particular one of the decoder output leads 548 to 552 in the apparatus of FIG. 3. When the relevant pulse signal occurs on that lead, the D-input assumes a low (0) signal level. Contemporaneously, a write pulse 810 is applied to the CLK-input, so that the low (0) signal level appears at the Q-output and the high (1) signal level appears at the $\overline{Q}$-output. The transistor 804 functions as a large pull-down device and in response to the high (1) signal level at its gate it is rendered conductive to cause the terminal 806 to assume the low (0) signal level due to the connection of this transistor 804 between the terminal 806 and a supply rail (OV). This low (0) signal level remains latched at the terminal 806 until the signal level at the D-input has changed and the next write pulse 810 occurs when the D-input will be at the high (1) signal level. As a consequence, the Q-output will now assume the high (1) signal level, so that for the duration of this next write pulse 810 the AND-gate 801 will be opened. The resulting high (1) signal level at the output of the gate 801 renders the transistor 803 conductive. This transistor 803 functions as a short-duration active pull-up device and when it is rendered conductive it causes the terminal 806 to assume the high (1) signal level due to the connection of the transistor 803 between the terminal 806 and the supply rail (+V). Once the transistor 803 ceases to conduct at the end of the write pulse 810 (when the gate 801 re-closes), the high (1) signal level at the terminal 806 is maintained via the resistor 805 as already described.

A possible modification for the circuit of FIG. 8 is, for instance, the use of a simple bistable latch in place of the flip-flop 800, together with an additional output stage which replaces the $\overline{Q}$-output function of the flip-flop. Also depending on the internal organization of the apparatus FIG. 3 is a practical implementation thereof, the lines 808 and 809 may be joined together and to a common internal bus in the apparatus. Furthermore, the input buffer amplifier 802 may not require strobing. Additionally, the resistor 805 may be implemented as a depletion mode field effect transistor in an integrated circuit realization of the circuit.

The data entry keyboard apparatus shown in FIG. 5 is an apparatus, in accordance with the invention, which enables a key-switch array to comprise a further 2n key switches in addition to the n/2×(n−1) key switches which the array normally comprises for n connection terminals. In FIG. 5 a key-switch array 900 comprises a basic set of six key switches 901 which can be selectively actuated to interconnect any two of four connection terminals 902 to 905 in a manner analogous to that described for the key-switch array of the apparatus of FIG. 3. The apparatus of FIG. 5 also comprises a sequencer 906, four input/output port circuits 908a/908b ... 911a/911b, a first set of six NOR-gates 912, a first set of latches 913, a second set of latches 914 and an encoder 915 which all generally have the same functions as the corresponding elements in the apparatus of FIG. 3. The ports can be of the form shown in FIG. 8. Additionally the key-switch array 900 in the apparatus of FIG. 5 comprises a second set of four additional key switches 916 to 919 and a third set of four additional key switches 920 to 923. An additional set of four NOR-gates 924, an additional set of four first latches 925 and an additional set of four second latches 926 are provided for the second set of key switches 916 to 919. Similarly, an additional set of NOR-gates 927, an additional set of four first latches 928, and an additional set of four second latches 929 are provided for the third set of key switches 920 to 923. Three sets of AND-gates 930, 931 and 932 are respectively connected between the outputs of the second latches of the respective sets 914, 926 and 929 and the encoder 915.

The set of key switches 916 to 919 use a supply rail (OV) to provide an active signal level for these key switches, so that no additional connection terminals are required on the logic circuits 941 specifically for these additional key switches. Also, the set of key switches 920 to 923 use a clock terminal 942 to provide their active signal level. This clock terminal can be an already existing connection terminal on the logic circuits 941 provided for some other purpose, so that this second set of key switches may not specifically require an additional connection terminal.

Figure 6:
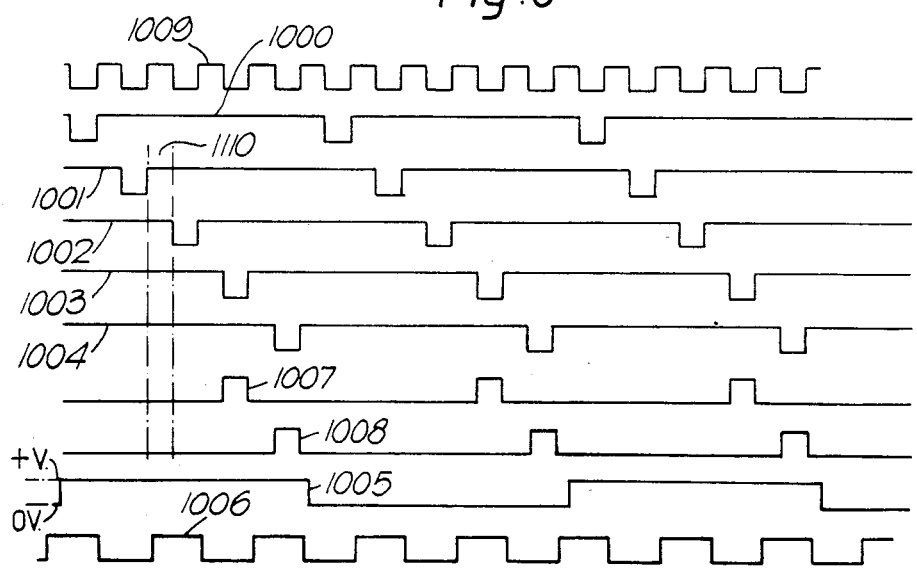
FIG. 6 shows idealized waveform diagrams of various pulse signals relating to the operation of the apparatus of FIG. 5.

In response to clock pulses 1009, the sequencer 906 produces the cycle of five pulse signals 1000 to 1004 shown in FIG. 6. The first three of these pulse signals 1000 to 1002 control the priming input of the set of NOR-gates 912 and are fed selectively by key-switch actuation to the enabling inputs of these gates. The pulse signal 1003 controls the priming input of each of the NOR-gates in the set 924. These latter gates pertain respectively to the four key switches 916 to 919, and actuation of the appertaining key switches applies a low (OV) signal level to the enabling input of the gates. The priming inputs of the set of NOR-gates 927 are controlled by a clock signal 1005 shown in FIG. 6. This clock signal 1005 has a high (+V) signal level and a low (OV) signal level, alternately, for successive cycles of the five pulse signals 1000 to 1004. Equivalently, a clock signal 1006 can be used instead of the clock signal 1005, which clock signal 1006 has a high (+V) signal level and a low (OV) signal level alternately during the occurrence of each of the pulse signals 1000 to 1004 in successive cycles thereof. The NOR-gates in the set 927 pertain respectively to the four key switches 920 to 923, and actuation of the appertaining key switches applies the prevailing clock signal level to the enabling input of the gates. The clock signal 1005 (or 1006) is produced by a pulse generator 907 in response to the clock pulses 1009. Inverters 934 and 935 provide re-setting signals (1007 and 1008, FIG. 6) for the first latches (913, 925, 928) and the second latches (914, 926, 929), respectively, from the pulse signals 1003 and 1004. As regards the setting and re-setting of the latches to provide the so-called first-press logic function, the operation of the apparatus is analogous to that described for the apparatus of FIG. 3.

Consideration of the operation of the apparatus of FIG. 5 will show that the following spurious signal conditions can result. Actuation of any one of the key switches 901 of the basic set will result in a particular one, and only one, of the NOR-gates in the set 912 producing an output signal. None of the NOR-gates in the other two sets 924 and 927 will be affected. However, actuation of any one of the key switches 920 to 923 when the signal level of the clock signal 1005 is low (OV), will give rise, during the period of the pulse signal 1003, to the spurious production of an output signal from that NOR-gate in the set 924 which pertains to the key-switch in the set 916 to 919 which is connected to the same connection terminal as the actuated key-switch. Similarly, during the period of each of the pulse signals 1000 to 1002, said actuation of any one of the key switches 920 to 923 will give rise to the spurious production of an output signal from one of the NOR-gates in the set 912. In the same way, actuation of any one of the key switches 916 to 919 will produce a spurious output signal from one of the NOR-gates in the set 927 when the clock signal is low (OV) and will also produce spurious output signals from one of the NOR-gates in the set 912 during the period of each of the pulse signals 1000 to 1003. In order to make these spurious output signals ineffectual, the apparatus further includes a priority detector arrangement which comprises three OR-gates 936, 937 and 938, the three sets of AND-gates 930, 931 and 932 already mentioned, and a signal priority detector 939. The OR-gates 936 to 938 have inputs connected to the data outputs of the latches in the second sets 914, 926 and 929, respectively, and apply a priority input signal to the priority detector 939 whenever one of the latches in the relevant set produces a high level output signal. If only one priority input signal is received by the priority detector 939 during a complete cycle of the pulse signals 1000 to 1004, then it produces a priority output signal, without any priority decision being necessary, which is applied to one input of each of the AND-gates in the relevant set 930, 931 or 932. One of the gates in this set will also be receiving the high level output signal from the latch concerned in the relevant second set, and will therefore produce an output signal to which the encoder 915 responds to produce an output signal code, on output leads 940, corresponding to the actuated key-switch. The priority detector 939 comprises simple logic to deal with, on a priority basis, more than one priority input signal which it receives during a cycle of the pulse signals 1000 to 1004.

If both the OR-gates 936 and 937 or 936 and 938 produce a priority input signal then the signal from gate 936 is assumed to be spurious and the priority detector 939 selects the other signal from the gate 937 or 938, as the case may be. If both the OR-gates 937 and 938 produce a priority signal, then the signal from gate 937 is assumed to be spurious and the priority detector 939 selects the other signal from the gate 938. If all three OR-gates 936 to 938 produce a priority signal than the signals from the gates 936 and 938 are assumed to be spurious and the priority detector 939 selects the signal from the gate 937. The priority detector 939 is reset once per cycle of the pulse signals 1000 to 1004 by the re-setting signal 1008.

It will be apparent that only the second set of additional key switches 916 to 919 and associated elements, or only the third set of additional key switches 920 to 923 and associated elements, may be added to the basic apparatus to extend the key-switch array.

In a micro-computer implementation of an apparatus which performs the same function as the apparatus in FIG. 5, the following decision logic may be applied. When all the pulse signals 1000 to 1003 are at a high signal level and the clock signal 1005 is also at a high signal level, then a low signal level detected at one of the connection terminals 902 and 905 must be due to the actuation of one of the key switches 916 to 919. If this detection is made then the relevant latch is set. If not, then when all the pulse signals 1000 to 1003 are next at a high signal level but the clock signal 1005 is now at a low signal level, then a low signal level detected at one of the connection terminals 902 to 905 can be assumed to be due to the actuation of one of the key switches 920 to 923. If this detection is made then the relevant latch is set. If not, when the clock signal 1005 is at the high signal level again, the signal levels pertaining to the key switches 901 are scanned during the next occurrence of the pulse signals 1000 to 1003 for the detection of the low signal level in respect to one of these latter key switches. In principle, using pulse signals such as 1000 to 1003 which define successive periods such as 1110 when they are all at a high signal level, the fourth pulse signal 1004 can be dispensed with for the detection of the actuation of one of the key switches 916 to 919.

We claim:

1. A data entry keyboard apparatus comprising an array of key switches and associated electronic logic circuits for detecting the actuation of a key switch and providing an output signal condition corresponding to an actuated key switch; in which apparatus the logic circuits have a plurality of connection leads for their interconnection with the key-switch array and include pulse sequencing means for producing in a recurrent cycle a plurality of pulse signals of different phases which are applied to successive ones of said connection leads to produce periodic active signal levels thereon, and the key switches of the array are interconnected with each other and with said connection leads such that any one of these leads can be interconnected with any other one by the actuation of an appropriate key switch, the output signal condition being determined by the active signal level of a particular pulse signal which is fed from one connection lead to another via an actuated key switch; characterized in that the key-switch array includes a set of additional key switches which afford selective interconnection between a common connection and a respective one of said connection leads, and comprising means for supplying to said common connection an active signal condition which produces on one of said connection leads, when the relevant additional key switch is actuated, an active signal level for determining an output signal condition corresponding to the actuated additional key switch.

2. A data entry keyboard apparatus as claimed in claim 1, characterized in that said means for supplying comprises a supply rail to which the common connection is connected, in that said pulse sequencing means produces an additional pulse signal in said recurrent cycle, and in that said logic circuits include priority detector means for permitting an output signal condition which is determined by actuation of one of said additional key switches and which occurs during the period of the additional pulse signal to be selected in preference to another output signal condition which is determined by actuation of one of the existing key switches and which occurs during the period of another pulse signal in the same pulse cycle.

3. A data entry keyboard apparatus as claimed in claim 1, characterized in that said common connection is a clock pulse connection, in that said pulse sequencing means is a clock pulse generator which is included in said logic circuits for producing on said clock pulse connection clock pulses such that for successive cycles of said pulse signals the clock pulse connection is alternately at a quiescent signal condition and at said active signal condition, and in that said logic circuits include priority detector means for permitting an output signal condition which is determined by actuation of one of said additional key switches when the clock pulse connection is at the active signal condition to be selected in preference to another output signal condition which is determined by actuation of one of the existing key switches.

4. A data entry keyboard apparatus as claimed in claim 2 or claim 3, for providing two sets of additional key switches, characterized in that the priority detector means in the logic circuit is further arranged to permit the output signal condition produced by actuation of one of the additional keys for the apparatus to be selected in preference to an output signal condition produced by actuation of another of the additional keys for the apparatus.

5. A data entry keyboard apparatus as claimed in claim 1, 2 or 3, characterized in that the logic circuits include a first plurality of coincidence gates which pertain respectively to the existing key switches and another plurality of coincidence gates associated with each set of additional key switches, with each gate pertaining to a respective key switch, the gates having respective first inputs connected to receive a particular one of said pulse signals from the pulse sequencing means and respective second inputs connected to receive that particular pulse signal by way of the key-switch array in response to actuation of the appertaining key-switch, and each of these gates producing an output signal condition in response to said particular pulse signal at both first and second inputs.

6. A data entry keyboard apparatus as claimed in claim 5, characterized in that said coincidence gates are NOR-gates.

7. A data entry keyboard apparatus as claimed in claim 1, 2 or 3, characterized in that said logic circuits are implemented as a microprocessor or microcomputer comprising a plurality of connection terminals for interconnection with the key-switch array; pulse sequencing means for producing a plurality of pulse signals of different phases; and means for performing recurrently a plurality of comparison functions which pertain respectively to the key switches provided in the key-switch array, the comparison functions involving the comparison of signals applied indirectly to said means via the key-switch array with pulse signals applied directly to said means, and each comparison function providing an output signal condition on comparing signals of the same active level applied to it both directly and indirectly, said output signal condition signifying detection of the actuation of the appertaining key-switch.

8. A data entry keyboard apparatus as claimed in claim 1, 2 or 3, characterized in that a single input/output port circuit for each connection terminal of the logic circuits at which a respective one of said connection leads is terminated comprises biasing means connected to the connection terminal and serving to bias the terminal at a quiescent signal level, this bias being overcome when the connection terminal receives an active signal level applied to the connection terminal in the input direction, the circuit further comprising a latch connected to receive a pulse signal to be applied to the connection terminal in the output direction and latched by a write pulse during the period of the pulse signal to drive an output device which holds the conection terminal at the active signal level, the latch being unlatched by a write pulse occurring during the period of the next pulse signal in the recurrent cycle of pulse signals to drive a re-setting device which restores the connection terminal to the quiescent signal level at which it is then held again by the biasing means.

9. A data entry keyboard apparatus as claimed in claim 8, characterized in that said latch is a D-type flip-flop which has the pulse signal to be applied to the connection terminal in the output direction, applied to its D-input, and the write pulses applied to its clock input, the inverting output of the flip-flop being connected to drive the output device, and the non-inverting output being connected to one input of a coincidence gate, the other input of which is connected to receive the write pulses and the output of which is connected to drive the re-setting device.

* * * * *